United States Patent
Machielsen

(10) Patent No.: US 7,123,011 B2
(45) Date of Patent: Oct. 17, 2006

(54) METHOD OF PRODUCING AN MRI IMAGE WITH GRADIENT DELAY COMPENSATION

(75) Inventor: Adrianus Maria Machielsen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 69 days.

(21) Appl. No.: 10/498,720

(22) PCT Filed: Dec. 18, 2002

(86) PCT No.: PCT/IB02/05601

§ 371 (c)(1),
(2), (4) Date: Jun. 15, 2004

(87) PCT Pub. No.: WO03/054570

PCT Pub. Date: Jul. 3, 2003

(65) Prior Publication Data

US 2005/0068028 A1    Mar. 31, 2005

(30) Foreign Application Priority Data

Dec. 21, 2001  (EP) ................................. 01205140

(51) Int. Cl.
*G01V 3/00* (2006.01)
(52) U.S. Cl. ....................... 324/318; 324/322
(58) Field of Classification Search ............... 324/318, 324/322
See application file for complete search history.

(56) References Cited

U.S. PATENT DOCUMENTS

| | | | |
|---|---|---|---|
| 5,150,055 A * | 9/1992 | Kimura et al. ............... | 324/322 |
| 5,227,728 A * | 7/1993 | Kaufman et al. ............ | 324/322 |
| 5,442,290 A | 8/1995 | Crooks ......................... | 324/309 |
| 6,025,715 A * | 2/2000 | King et al. .................. | 324/309 |
| 6,275,040 B1 | 8/2001 | Zur .............................. | 324/320 |
| 6,369,572 B1 * | 4/2002 | Van Groningen et al. .. | 324/322 |

FOREIGN PATENT DOCUMENTS

| | | |
|---|---|---|
| EP | 0 291 157 A2 | 11/1988 |
| JP | 07303619 | 11/1995 |
| JP | 08056917 | 3/1996 |
| JP | 11 089817 | 4/1999 |

OTHER PUBLICATIONS

Aldefeld, B., et al.; Effects of Gradient Anisotropy in MRI; 1998; MRM;39:606-614.

* cited by examiner

*Primary Examiner*—Louis M. Arana

(57) ABSTRACT

Gradient pulses are generated by current conducting gradient coils. High-frequency components cause the center of gravity of the current to be shifted by mutual influencing of the coil conductors. The shift depends on the electrical resistance of the conductor material, which in turn depends on the temperature of said conductor material, and on the frequency $\omega$, such that the magnetic gradient field B decreases with increasing frequency. This phenomenon manifests itself as a delay $\tau$ of the gradient pulse with respect to the gradient demand D. During generation of a current gradient pulse in accordance with the gradient demand D, a quantity representing the conducting state of the conductors of the gradient system is determined and used to calculate the gradient delay $\tau$ to correct the gradient demand for the delay.

17 Claims, 2 Drawing Sheets

METHOD OF PRODUCING AN MRI IMAGE WITH GRADIENT DELAY COMPENSATION

BACKGROUND

The invention relates to a method of producing an MRI image in an MRI apparatus, wherein a gradient field is generated by a gradient system, wherein the desired variation with respect to time of the gradient field is prescribed by a gradient demand, and wherein a quantity representing the effective conduction state of the gradient system is determined during the generation of gradient pulses forming the gradient field.

Such a method is known from Japanese patent abstract No. JP 07303619. In an MRI apparatus, the desired variation of the gradient pulses required for a recording is generally prescribed by a representation of the desired field, the so-termed gradient demand. This is a frequently numerically stored representation of the desired variation of the magnetic gradient field as a function of time. Due to a variety of causes, the actually generated gradient field differs in shape from the gradient demand. An important cause for this deviation is the temperature of the gradient coils in the gradient system, which may differ from the assumed temperature due to ambient influences and due to the previous history of the use of these coils.

In said Japanese patent document, the temperature of a heat shield in the environment of the gradient system is measured at regular intervals during an MRI scan. Said temperature thus forms a quantity representing the effective conduction state of the gradient system, the term effective conduction state being taken to mean the electric conduction as it manifests itself in all current-conducting parts of the gradient system, such as the gradient coils, shielding coils (if any) and other metal parts which influence, due to eddy current induction, the formation of the magnetic gradient field. Said temperature is used as an input quantity to determine a correction in the form of a change of the eddy current compensation volume. In this known method, the temperature is measured of a part which is only indirectly involved in the formation of the gradient pulses, as a result of which the effect of the variation in temperature of the gradient coil is insufficiently compensated for.

It is an object of the invention to provide a method of the type mentioned in the opening paragraph, wherein a better compensation for the variation in temperature of the gradient coil is achieved. To achieve this object, the method in accordance with the invention is characterized in that during the generation of the gradient pulses, a gradient delay is determined on the basis of at least the value of said representing quantity, during the gradient pulses the instantaneous value of the gradient demand is corrected for the then prevailing value of the gradient delay, and the instantaneous value of the gradient pulses is determined by the value of the corrected gradient demand.

SUMMARY

The invention is based on the following recognition. To generate the magnetic gradient pulses use can be made of current-conducting gradient coils which are formed by, for example, a cylindrically curved copper plate wherein tracks are provided, such that the conductors take the form of comparatively wide, juxtaposed strips. In the case of stationary current conduction through these strips, the location of the current is substantially in the center of the relevant strip. In the case of currents with high-frequency components, as for the generation of gradient pulses, the center of gravity of the current is shifted as a result of mutual influencing of the strip-shaped conductors, which is also referred to as current displacement. This displacement depends (at a given shape of the strip) on inter alia the electric resistance of the conductor material, which resistance depends in turn on the temperature of said material. In addition, the magnitude of this displacement depends on the frequency of the current, i.e. the actually generated magnetic gradient field decreases with the frequency of the current in accordance with a certain amplitude characteristic and the associated phase characteristic. The shape of these characteristics depends on inter alia the resistance of the strip material. The leading edge of the trapezoidal gradient pulse can now be subjected to a Fourier analysis, the attenuation of the frequency components thus obtained can be determined by means of the amplitude characteristic, and the attenuated frequency components thus obtained can be recomposed. It then appears that the resultant gradient pulse deviation manifests itself, in a good approximation, as a delay of the actual magnetic gradient pulse relative to the gradient demand. This delay (the gradient delay) can be determined by means of said amplitude characteristic and the associated phase characteristic, provided that said characteristics are known at any instant of the gradient pulse, i.e. if the resistance of the material is known at any moment in time. Via said representing quantity this resistance can be determined in various ways, both theoretically and experimentally, and both during and before the occurrence of the gradient pulse. The gradient delay can now be used to correct the gradient demand, for example by providing the latter with a time shift such that said time shift compensates for the gradient delay. If this occurs continuously during the formation of the gradient pulse, a high degree of accuracy of the correction is achieved. The width of the conductors as distributed over the gradient coil leads to a spatial dependency of the delay of the field. If this spatial distribution of the delay is reasonably similar to that of an imaginary static field, the resultant change in delay can be corrected with a delay correction of the gradient demand signal.

In a first embodiment of the invention, said representing quantity is obtained from a model of the MRI apparatus, at least the gradient demand as well as the variation of a number of gradient pulses directly preceding the current gradient pulse being used as the input quantities. In this manner, the temperature or the electric resistance of the gradient coil does not have to be measured directly; such measurements can be inconvenient sometimes because of the poor accessibility of said coils. Said model can be formed in various ways, for example by supplying a single time a large number of series of the possible types of gradient pulses and measuring the gradient delay taking place. It is alternatively possible however to forecast the heat development and heat transfer in the relevant coil configuration on the basis of computer simulation or on theoretical grounds.

In another embodiment of the invention, said representing quantity is obtained from a model of the MRI apparatus, at least the temperature of at least one representative point of the gradient coil generating the relevant gradient pulse being used as the input quantity. This embodiment is advantageous if the temperature of the gradient coil can be measured in one or more points. In this manner, the material resistance of the coil can be determined more directly and hence more accurately.

In a more specific embodiment of the invention, the effective conduction state of the quantity representing gradient coils is formed by the resistance of the gradient coil generating the relevant gradient pulse, in which embodiment the model of the MRI apparatus comprises a look-up table that defines the relationship between the temperature of said representative point and the resistance of said relevant gradient coil, as a result of which the resistance of the gradient coil can be derived from the temperature of the at least one point of the gradient coil generating the relevant gradient pulse. The look-up table can be compiled in various ways, for example experimentally via computer simulation or on theoretical grounds via calculating the heat transfer in the relevant parts of the MRI apparatus. As the look-up table has to be compiled only once (i.e. during the manufacture of the apparatus or only during the manufacture of the first specimen of a certain type) and is subsequently stored in each apparatus, a high degree of calculation efficiency in the apparatus is achieved.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

DETAILED DESCRIPTION

Generally, in an MRI apparatus for medical purposes gradient pulses are generated to select the areas to be imaged by means of the apparatus. Such gradient pulses take the form of a trapezium with a typical rise time of 0.2 ms, a typical pulse duration of 2 ms and a typical decay time of 0.2 ms. The desired shape of the gradient pulse is prescribed by a demand signal generated by the control computer of the apparatus. This signal takes the form of the desired variation of the magnetic gradient field at a prescribed location in the imaging volume of the apparatus. The magnetic field of the gradient pulses is generated by means of a current that is sent through the gradient coils, which coils may be formed from cylindrically curved copper plate wherein tracks are provided, such that the conductors take the form of comparatively wide juxtaposed strips. At alternating currents, current displacement occurs as the conductors mutually influence each other. Said displacement depends, inter alia, on the electric resistance of the conductor material, which resistance depends in turn on the temperature of said material. In addition, the displacement depends on the frequency of the current, such that the actually generated magnetic gradient field decreases with the frequency of the current in accordance with a specific amplitude characteristic and the associated phase characteristic.

Figure 1A:
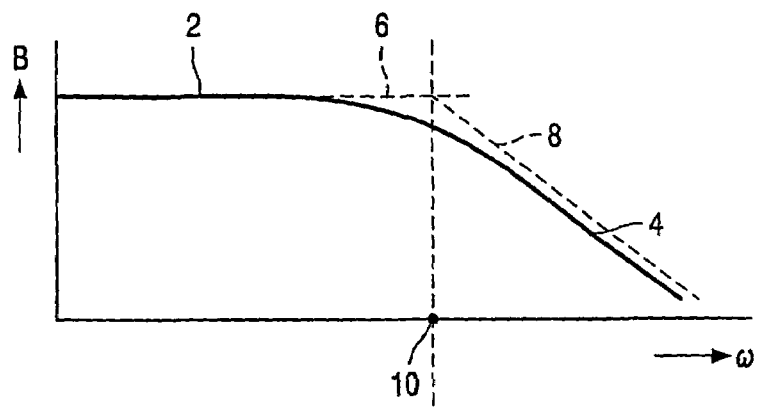
FIG. 1a is a graphic representation of a typical amplitude variation of a gradient field as a function of frequency.
Figure 1B:
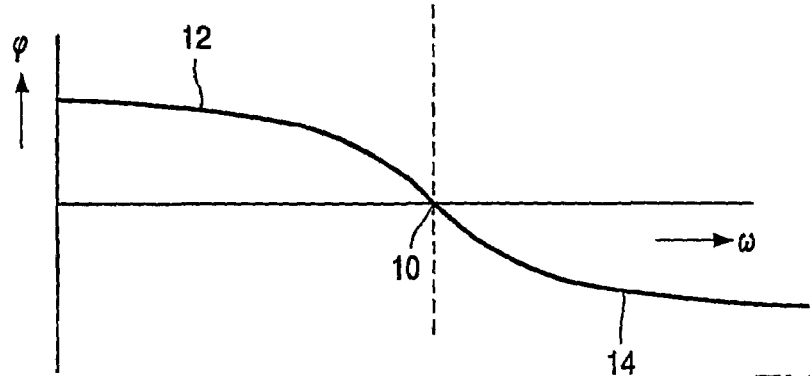
FIG. 1b is a graphic representation of a typical phase shift of a gradient field as a function of frequency.

To illustrate the problem that lies at the bottom of the invention, FIG. 1a shows a typical amplitude characteristic, and FIG. 1b shows a typical phase characteristic. The amplitude characteristic shows the variation of the amplitude B of the gradient field as a function of the frequency $\omega$ at a representative location in the imaging volume, the phase characteristic shows the variation of the phase $\phi$ of the gradient field as a function of the frequency $\omega$ at the same location. For low frequencies (see area 2) no attenuation of the field occurs, so that the graph extends horizontally in that area. For higher frequencies an attenuation occurs of 1.5 to 3 db/octave in a first-order approximation, see area 4. As is customary in the case of an amplitude variation of this type, the deflection point 10 of the graph coincides with the point of intersection of the two asymptotes 6 and 8.

In the phase characteristic (see FIG. 1b), for low frequencies (see area 12) initially no phase rotation of the field takes place, so that the graph extends horizontally in that area. The strongest variation of the phase rotation takes place for frequencies in the vicinity of the tilting point, while for still higher frequencies the phase change becomes substantially constant again, see area 14.

Figure 1C:
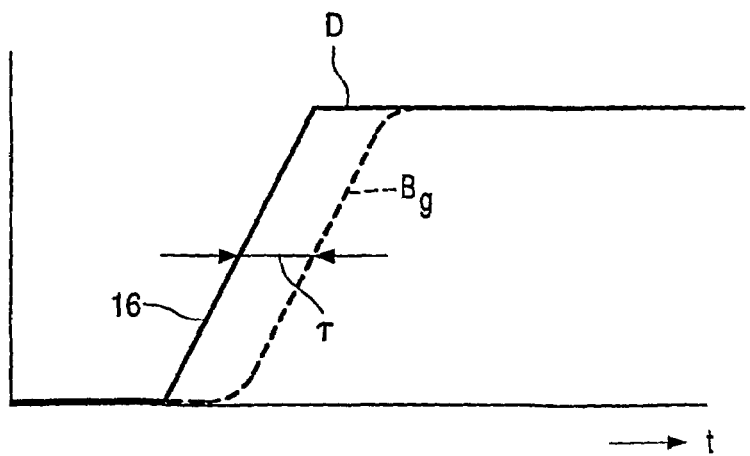
FIG. 1c shows the demand signal and the variation of the actual magnetic gradient field as a function of time.

The frequency components present in the leading edge 16 (see FIG. 1c) of the trapezoidal demand signal D are each attenuated in accordance with the attenuation factor shown in FIG. 1a, and these components are additionally subject to a phase rotation in accordance with FIG. 1b. The frequency components thus changed can now be composed again (added together or integrated) into a resulting signal B which is a representation of the magnetic gradient field as observed after said phase and amplitude deformations in the imaging volume of the MRI apparatus. It has been found that this resulting signal B is, in good approximation, similar in form to the demand signal D, but it has undergone a time delay $\tau$, referred to as gradient delay, with respect to said demand signal. The gradient delay $\tau$ thus can be determined by means of said phase and amplitude characteristic, provided that said characteristics are known at each instant of the gradient pulse, i.e. if the resistance of the material in the gradient system, in particular the resistance at each location in the conductors in the gradient coil is known at each instant. This resistance distribution can be represented by means of one number, the so-termed representing quantity.

The representing quantity can be determined in various ways, both theoretically and experimentally, and before as well as during the gradient pulse.

Figure 2A:
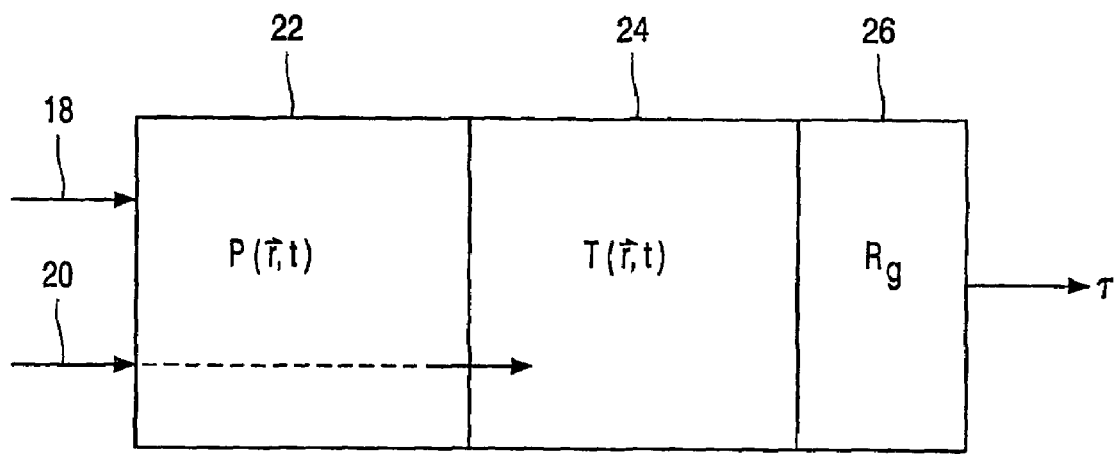
FIG. 2a is a diagrammatic representation of a first embodiment of a delay model of the MRI apparatus in accordance with the invention.

FIG. 2a diagrammatically shows a first embodiment of a delay model of the MRI apparatus in accordance with the invention. This model is composed of three sub-parts 22, 24 and 26 which are each responsible for a part of the processing of the input quantities to the gradient delay $\tau$. In this embodiment, the input quantities are formed by the gradient demand D which is supplied to an input 18, and by the variation of a number of gradient pulses directly preceding the current gradient pulse, which are referred to as the previous history and are supplied to input 20. By means of these two quantities, the electric power P dissipated in the relevant parts of the gradient system is calculated in sub-part 22, which dissipated electric power P can be determined, dependent upon the required accuracy, as a function of place and time P(r,t). The power distribution P(r,t) thus calculated can now be used to calculate the temperature distribution T(r,t) in sub-block 24. From this temperature distribution a quantity representing the effective conduction state of the gradient system can now be determined in sub-block 26, which quantity is, in this case, the resistance of the gradient coils $R_g$. When this resistance is known, it can be used to determine the amplitude and phase characteristics for the relevant situation (i.e. the given gradient demand D and the previous history) from which the gradient delay τ can be determined in the manner described with reference to FIG. 1.

The contents of sub-part 22 can be determined in a number of ways. In a first way use is made of existing simulation programs for computers which, at a given distribution of the conductors, are capable of representing the associated current distribution in a gradient system, from which the power distribution can be determined using the known resistivities. It is also possible to measure the current distribution at various locations in the gradient system, or to calculate (possibly approximatively) the current distribution on theoretical grounds. Instead of carrying out said power-calculation steps explicitly, it is alternatively possible to measure the temperature distribution at a given current supply (on the basis of the gradient demand), and hence go straight to the execution of sub-block 24. After the temperature distribution has been determined, it is possible to determine the gradient delay as described hereinabove.

The contents of sub-part 24 can also be determined in a number of different ways. In a first way use is made of existing simulation programs for computers which, at a given power distribution P(r,t), are capable of representing the associated temperature distribution. Alternatively, at one or more locations in the gradient system the temperature can be measured or calculated (possibly approximatively) on theoretical grounds, and a (possibly approximated) complete distribution of the temperature can be determined from this by means of the known material distribution in the MRI apparatus. After the temperature distribution has been determined it is possible to determine the gradient delay as described hereinabove.

Figure 2B:
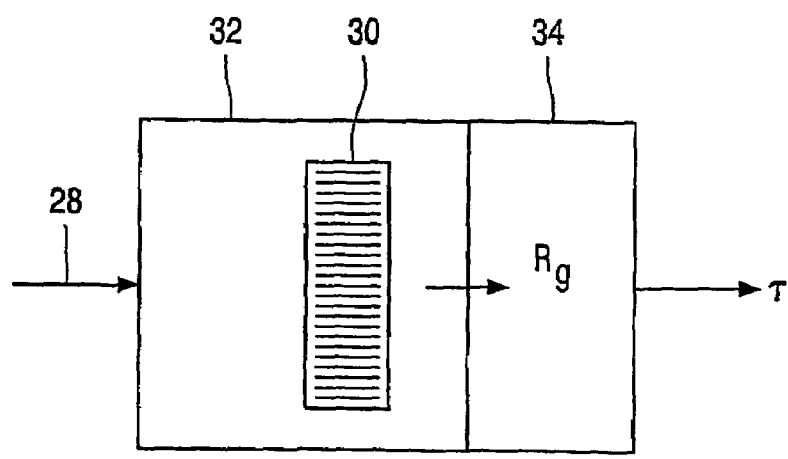
FIG. 2b is a diagrammatic representation of a second embodiment of a delay model of the MRI apparatus in accordance with the invention.

FIG. 2b diagrammatically shows a second embodiment of a delay model of the MRI apparatus in accordance with the invention. An input quantity 28 is supplied to this model, which input quantity is important for the instantaneous determination of the gradient delay τ. The relevant input quantity 28 is, in this case, the temperature of a representative point of the gradient coil generating the relevant gradient pulse. Via previous measurements or calculations, the connection between this particular temperature and the temperature distribution can be (approximatively) defined, so that, if desired, the resultant spatial and time-variable temperature distribution can be derived. This derivation may also be implicitly present in the numerical values of a look-up table 30 that forms part of the process in accordance with sub-part 32. In table 30, the temperature of said representative point is defined each time as the input quantity, and the resistance of the relevant gradient coil associated with said temperature is defined as the output quantity, as a result of which the resistance of the gradient coil can be derived from the temperature of said one point. In the manner already mentioned hereinabove, the gradient delay τ can then be determined from said resistance value.

The gradient delay τ can now be used to correct the gradient demand, for example by providing the latter with a time shift such that it compensates for the gradient delay. If this takes place continuously during the formation of the gradient pulse, a high degree of accuracy of the correction is achieved.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A method of controlling generation of gradient pulses in a magnetic resonance imaging apparatus, the method comprising:
    generating a series of gradient demands which prescribe the gradient pulses to be generated;
    during generation of the gradient pulses, determining a quantity representing an effective conduction state of a gradient pulse generating coil;
    during the generation of the gradient pulses, determining on the basis of at least the representing quantity a preset value of a gradient delay which changes with the effective conduction state;
    correcting the gradient demands for the current gradient delay value of the gradient delay during the generation of the gradient pulses.

2. The method as claimed in claim 1, wherein said representing quantity is obtained from:
    a model of the MRI apparatus,
    the gradient demand D, and
    a variation of a number of gradient pulses directly preceding the current gradient pulse being generated.

3. The method as claimed in claim 1, wherein said representing quantity is obtained from:
    a model of the MRI apparatus, and
    a temperature of at least one representative point of the gradient coil currently generating one of the gradient pulses.

4. The method as claimed in claim 3, wherein the effective conduction state is a resistance of the gradient coil currently generating one of the gradient pulses, and wherein the model of the MRI apparatus comprises a look-up table that defines a relationship between the temperature of said representative point and a resistance of said gradient coil, currently generating the gradient pulse.

5. An MRI apparatus embodied so as to comprise processor means for carrying out the method as claimed in any one of the preceding claims.

6. The method as claimed in claim 1, wherein the representing quantity is repeatedly updated during the generation of each gradient pulse.

7. The method as claimed in claim 1, wherein determining the representing quantity includes:
    determining electrical power dissipated by the gradient coil currently generating one of the gradient pulses.

8. The method as claimed in claim 7, wherein the dissipated electrical power is determined from:
    a current value of the gradient demand,
    a history of preceding gradient pulses, and
    a current distribution in conductors of the gradient coil currently generating one of the gradient pulses.

9. The method as claimed in claim 7, wherein determining the representing quantity further includes:
    determining a temperature distribution for conductors of the gradient coil currently generating one of the gradient pulses from the determined electrical power dissipation.

10. The method as claimed in claim 1, wherein determining the representing quantity further includes:
    determining a temperature distribution for conductors of the gradient coil currently generating one of the gradient pulses.

11. The method as claimed in claim 10 wherein determining the temperature distribution includes:
    determining temperature at one or more points on conductors of the gradient coil currently generating one of the gradient pulses;

determining one of the temperature distribution and the effective conductive state of the coil currently generating one of the pulses from the temperature at the one or more points.

12. The method as claimed in claim 11, wherein the temperature distribution is determined from the temperature at the one or more points using a pre-programmed look-up table.

13. A look-up table pre-programed for use in the method as claimed in claim 12.

14. The method as claimed in claim 10 wherein determining the temperature distribution includes:
  determining temperature at one or more points on the conductors of the gradient coil currently generating one of the gradient pulses;
  inputting the temperature determined at the one or more points into a look-up table which is pre-programmed to retrieve a current value of the representing quantity.

15. An apparatus including means for performing each of the steps as claimed in claim 1.

16. A computer medium programmed to perform the method as claimed in claim 1.

17. An MRI apparatus comprising:
  gradient pulse generating coils; and
  a processor programmed to perform the steps of:
  generating a series of gradient demands which prescribe the gradient pulses to be generated;
  determining a quantity representing an effective conduction state of a gradient pulse generating coil, during generation of the series of gradient pulses;
  on the basis of at least the representing quantity, determining a current value of a gradient delay which changes with the effective conduction state on the basis of at least the representing quantity during the generation of the gradient pulses;
  correcting the gradient demands for the current gradient delay value of the gradient delay during the generation of the gradient pulses.

* * * * *